US012568803B2

(12) United States Patent　　　(10) Patent No.:　US 12,568,803 B2
Kaliappan et al.　　　　　　　　(45) Date of Patent:　　　Mar. 3, 2026

(54) METHODS OF FORMING INTERCONNECT STRUCTURES

(71) Applicant: Applied Materials, Inc., Santa Clara, CA (US)

(72) Inventors: Muthukumar Kaliappan, Fremont, CA (US); Bhaskar Jyoti Bhuyan, San Jose, CA (US); Yong Jin Kim, Albany, CA (US); Carmen Leal Cervantes, Mountain View, CA (US); Xiangjin Xie, Fremont, CA (US); Jesus Candelario Mendoza-Gutierrez, San Jose, CA (US); Aaron Dangerfield, San Jose, CA (US); Michael Haverty, Mountain View, CA (US); Mark Saly, Santa Clara, CA (US); Kevin Kashefi, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 559 days.

(21) Appl. No.: 18/117,203

(22) Filed: Mar. 3, 2023

(65) Prior Publication Data

US 2024/0297073 A1　　Sep. 5, 2024

(51) Int. Cl.
H01L 21/768　　　(2006.01)

(52) U.S. Cl.
CPC .. H01L 21/76843 (2013.01); H01L 21/76831 (2013.01); H01L 21/76877 (2013.01)

(58) Field of Classification Search
CPC ............. G03F 7/0758; H01L 21/76859; H01L 21/0217; H01L 21/32; H01L 21/0337; H01L 21/76229; H01L 21/76843; H01L 23/528
See application file for complete search history.

(56) References Cited

U.S. PATENT DOCUMENTS

| | | | |
|---|---|---|---|
| 6,884,571 B2 * | 4/2005 | Uenishi ................. | G03F 7/0758 |
| | | | 430/323 |
| 9,112,003 B2 | 8/2015 | Haukka et al. | |
| 9,911,594 B2 | 3/2018 | Nemani et al. | |
| 9,997,373 B2 | 6/2018 | Hudson | |
| 10,818,510 B2 | 10/2020 | Kaufman-Osborn et al. | |
| 2007/0298585 A1 * | 12/2007 | Lubomirsky ..... | H01L 21/76229 |
| | | | 257/E21.548 |
| 2010/0055621 A1 * | 3/2010 | Hatakeyama ....... | H01L 21/0337 |
| | | | 430/326 |

(Continued)

OTHER PUBLICATIONS

Self-Assembled Monolayers (SAMs), Gelest (2023), 6 pages.
(Continued)

*Primary Examiner* — Andrew J Bowman
(74) *Attorney, Agent, or Firm* — SERVILLA WHITNEY LLC

(57) ABSTRACT
Methods of forming semiconductor devices by enhancing selective deposition are described. In some embodiments, a blocking layer is deposited on a metal surface before deposition of a barrier layer. The methods include exposing a substrate with a metal surface, a dielectric surface and an aluminum oxide surface or an aluminum nitride surface to a blocking molecule to form the blocking layer selectively on the metal surface over the dielectric surface and one of the aluminum oxide surface or the aluminum nitride surface.

20 Claims, 4 Drawing Sheets

(56) References Cited

U.S. PATENT DOCUMENTS

| 2017/0330794 A1* | 11/2017 | Hourani | H01L 23/528 |
| 2020/0090924 A1* | 3/2020 | Wu | H01L 21/32 |
| 2020/0234943 A1* | 7/2020 | Bhuyan | H01L 21/0217 |
| 2021/0351136 A1* | 11/2021 | Shen | H01L 21/76859 |

OTHER PUBLICATIONS

U.S. Appl. No. 17/682,431, filed Feb. 28, 2022, 50 pages.
U.S. Appl. No. 63/410,721, filed Sep. 28, 2022, 26 pages.
U.S. Appl. No. 63/482,052, filed Jan. 29, 2023, 38 pages.
U.S. Appl. No. 63/482,295, filed Jan. 30, 2023, 36 pages.
Goronzy, Dominic Pascal, "Intermolecular Interactions and Surface Properties of Self-Assembled Monolayers of Functional Boron Clusters", UCLA Electronic Theses and Dissertations (2019), 243 pages.

* cited by examiner

METHODS OF FORMING INTERCONNECT STRUCTURES

TECHNICAL FIELD

Embodiments of the disclosure generally relate to methods of forming interconnect structures in microelectronic devices. More particularly, embodiments of the disclosure are directed to methods of improving selective deposition of metal on dielectric surfaces during formation of interconnect structures in microelectronic devices.

BACKGROUND

The semiconductor industry faces many challenges in the pursuit of device miniaturization which involves rapid scaling of nanoscale features. Such issues include the introduction of complex fabrication steps such as multiple lithography steps and integration of high-performance materials. Selective deposition has shown promise in device miniaturization as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor. For example, a self-assembled monolayer (SAM) can be formed on a surface to prevent subsequent deposition on that surface.

Current state of the art self-assembled monolayers do not inhibit growth of tantalum nitride barrier layers on tungsten surfaces. With oxygen and nitrogen based bifunctional SAMs, growth of tantalum nitride on metallic tungsten can be reduced. However, bifunctional SAMs also inhibit tantalum nitride growth on an aluminum oxide surface, which are frequently used as etch stop layers in electronic devices. Inhibition of the tantalum nitride barrier on the aluminum oxide layer/surface results in reduced electrical performance of the electronic devices.

Accordingly, there is an ongoing need in the art for methods of improving selective deposition of metal on dielectric surfaces during formation of interconnect structures in microelectronic devices.

SUMMARY

One or more embodiments of this disclosure relate to a method of forming a microelectronic device. The method comprises exposing a feature extending into a semiconductor substrate to a silane having a general formula of $R_{(4-n)}Si(CH_3)_n$, where n is 1 to 4, and each R is independently selected from an alkyl, aryl, alkene, alkyne group having in a range of from 1 to 22 carbon atoms to form a blocking layer. The feature defines a gap including a metal surface, a dielectric surface, and an aluminum oxide surface or an aluminum nitride surface, and the blocking layer forms selectively on the metal surface over the dielectric surface and one of the aluminum oxide surface or the aluminum nitride surface. The method further comprises selectively depositing a barrier layer on the dielectric surface and one of the aluminum oxide surface or the aluminum nitride surface over the blocking layer; and removing the blocking layer.

Additional embodiments of this disclosure relate to a method of forming a microelectronic device. The method comprises exposing a feature extending into a semiconductor substrate to a blocking molecule comprising a general formula of $H_3Si$—$SiR_3$, where R is independently selected from an alkyl, aryl, alkene, alkyne group having in a range of from 1 to 22 carbon atoms to form a blocking layer. The feature defines a gap including a metal surface, a dielectric surface, and an aluminum oxide surface or an aluminum nitride surface, and the blocking layer forms selectively on the metal surface over the dielectric surface and one of the aluminum oxide surface or the aluminum nitride surface. The method further comprises selectively depositing a barrier layer on the dielectric surface and one of the aluminum oxide surface or the aluminum nitride surface over the blocking layer; and removing the blocking layer.

Further embodiments of this disclosure relate to a method of forming a microelectronic device. The method comprises exposing a feature extending into a semiconductor substrate to a blocking molecule comprising one or more of 1,2-phenylenebis(trimethylsilane) or 1,4-bis(trimethylsilyl)-1,3-butadiyne to form a blocking layer. The feature defines a gap including a metal surface, a dielectric surface, and an aluminum oxide surface or an aluminum nitride surface, and the blocking layer forms selectively on the metal surface over the dielectric surface and one of the aluminum oxide surface or the aluminum nitride surface. The method further comprises selectively depositing a barrier layer on the dielectric surface and one of the aluminum oxide surface or the aluminum nitride surface over the blocking layer; and removing the blocking layer.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
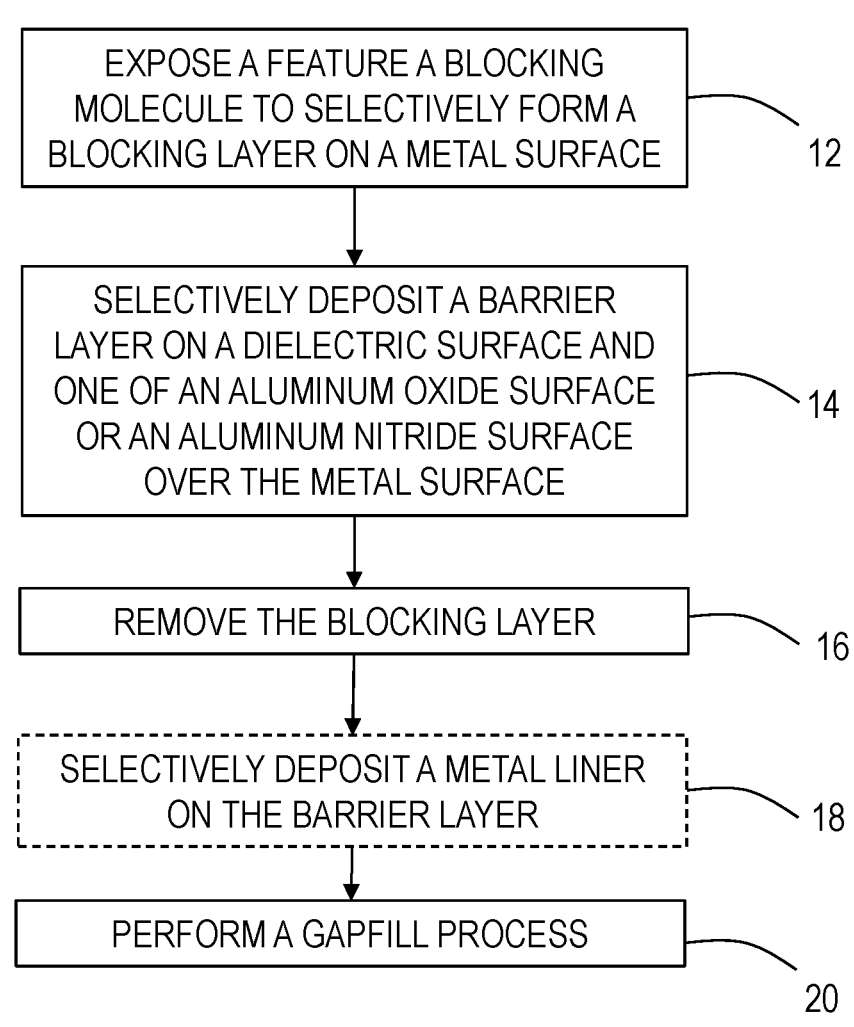
FIG. 1 illustrates a process flow diagram of a method of forming a microelectronic device in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as rectangular or square panes. In some embodiments, the substrate comprises a rigid discrete material. What a given substrate surface comprises will depend on what films are to be deposited, as well as the particular chemistry used.

"Atomic layer deposition" or "cyclical deposition" as used herein refers to a process comprising the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

Embodiments of the disclosure provide methods for depositing blocking layers on metal surfaces. Embodiments of the disclosure identify methods for depositing blocking layers which may be used separately or in conjunction with one another.

Embodiments of the disclosure advantageously provide methods for depositing barrier materials (e.g., tantalum nitride (TaN)) on dielectric surfaces by blocking deposition of barrier materials on metal surfaces through blocking layers deposited on the metal surfaces.

Embodiments of the disclosure provide methods of forming interconnect structures in the manufacture of microelectronic devices. In one or more embodiments, microelectronic devices described herein comprise at least one top interconnect structure that is interconnected to at least one bottom interconnect structure. Embodiments of the disclosure provide microelectronic devices and methods of manufacturing microelectronic devices that improve performance of interconnects, for example, reducing via resistance.

A generic process flow of a method 10 of forming a microelectronic device according to one or more embodiments of the disclosure is described with respect to FIGS. 1 to 7. The methods (e.g., method 10) described herein can be used to form semiconductor devices or interconnects for semiconductor devices. An interconnect, as used in this manner, is a conductive portion of an electronic device that allows electrical connection between different layers of the electronic device.

The method 10 in FIG. 1 includes exposing a feature extending into a semiconductor substrate to blocking molecule to form a blocking layer, the feature defining a gap including a metal surface, a dielectric surface, and an aluminum oxide surface or an aluminum nitride surface, the blocking layer forming selectively on the metal surface over the dielectric surface and one of the aluminum oxide surface or the aluminum nitride surface (operation 12); selectively depositing a barrier layer on the dielectric surface and one of the aluminum oxide surface or the aluminum nitride surface over the blocking layer (operation 14); removing the blocking layer (operation 16); optionally, selectively depositing a metal liner on the barrier layer (operation 18); and performing a gapfill process (operation 20).

It has been advantageously found that the methods described herein, such as method 10, reduce resistance of a via by at least 20% as compared to a method that does not include forming a blocking layer that forms selectively on a metal surface relative to a dielectric surface and an aluminum oxide surface or an aluminum nitride surface.

Figure 2:
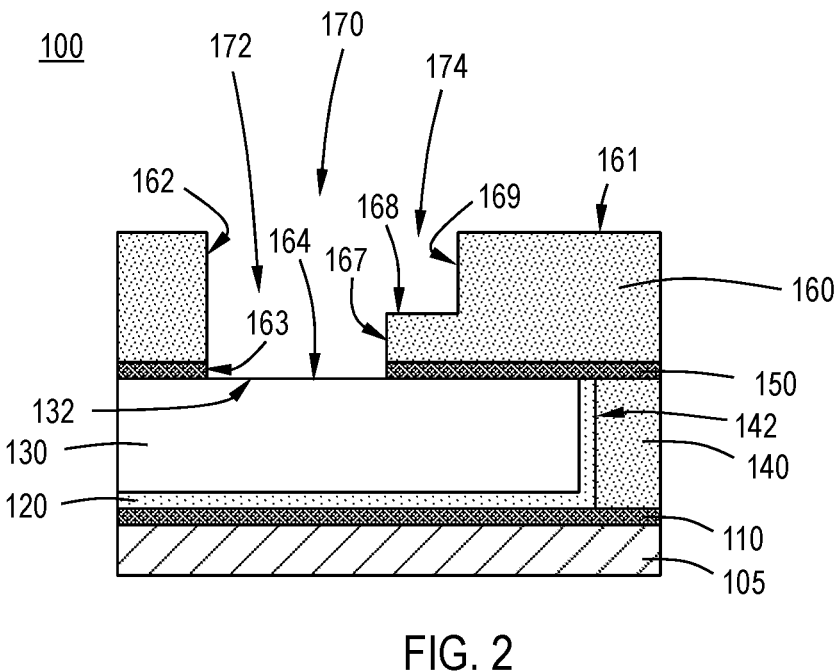
FIG. 2 illustrates a cross-sectional schematic view of a microelectronic device prior to a selective deposition process in accordance with one or more embodiment of the disclosure.

FIG. 2 illustrates an exemplary embodiment of an electronic device 100. The skilled artisan will recognize that the illustrated embodiment is merely exemplary of one possible configuration and that the scope of the disclosure is not limited to the illustrated electronic device structure.

The electronic device 100 illustrated in FIG. 2 has a substrate 105 with a first layer 110 formed thereon. Substrate 105 can be any suitable substrate material for use with an electronic device. In some embodiments, the substrate 105 is a semiconductor substrate. In some embodiments, the substrate 105 can include additional layers of dielectrics, metals, etch stop layers and semiconductor layers including underlying circuits (e.g., transistors, capacitors) that have been formed in prior processes.

Those skilled in the art will understand that the use of ordinals such as "first" and "second" to describe different layers or films does not imply a specific location or number within the electronic device, or order an order of formation. A "second" layer of a material can be formed without a "first" layer being present. The ordinals are used for descriptive purposes when referring to the Figures.

The first layer 110 is an optional layer. In some embodiments, the first layer 110 is omitted. In some embodiments, the first layer 110 is made up of a lamination of more than one layer. The first layer 110 can have any suitable function including, but not limited to, acting as an etch stop layer for previous or future microelectronic device manufacturing operations.

A first dielectric layer 140 is formed on a portion of the first layer 110. The first dielectric layer 140 has an inner sidewall 142 which defines a boundary of the first dielectric layer 140, leaving an opening. The opening can be, for example, a trench for a first metallization layer of the electronic device 100.

The first dielectric layer 140 can be any suitable material formed by any suitable technique known to the skilled artisan. In some embodiments, the first dielectric layer 140 comprises one or more of an oxide or nitride. In some embodiments, the first dielectric layer 140 comprises silicon oxide. The first dielectric layer 140 of some embodiments is deposited by one or more of chemical vapor deposition (CVD), atomic layer deposition (ALD), plasma-enhanced chemical vapor deposition (PECVD), plasma-enhanced atomic layer deposition (PEALD), physical vapor deposition (PVD), or spin-on techniques.

The dielectric surface of the first dielectric layer 140 on the substrate 105 may comprise any suitable dielectric materials. Suitable dielectric materials include, but are not limited to, oxides (e.g., silicon oxides), low-K dielectric materials, and high-k dielectric materials. In some embodiments, the dielectric surface consists essentially of silicon oxide. As used in this manner, the term "consists essentially of" means that the surface is greater than or equal to about 95%, 98% or 99% of the stated material, on an area basis. In some embodiments, the first dielectric layer 140 comprises one or more of silicon oxide ($SiO_2$), silicon nitride (SiN), silicon carboxynitride (SiCON), silicon oxycarbide (SiOC), aluminum oxide (AlOx), or aluminum nitride (AlNx).

In some embodiments, a liner 120 is formed on the top surface of the first layer 110 and abutting the inner sidewall 142 of the first dielectric layer 140. The liner 120 of some embodiments acts as one or more of an adhesion layer, barrier layer, or liner. The liner 120 can be any suitable material, including, but not limited to, oxides and nitrides. The liner 120 can be formed by any suitable technique known to the skilled artisan. In some embodiments, the liner 120 is formed as a conformal film by atomic layer deposition (ALD).

In some embodiments, a first metal layer 130 is formed on the liner 120 and forms a first metallization layer. The first metal layer 130 can be any suitable material known to the skilled artisan deposited by any suitable technique. Suitable metal materials include, but are not limited to, metals, metal nitrides, metal alloys, and other conductive materials. In some embodiments, the first metal layer 130 comprises one or more of copper (Cu), cobalt (Co), tungsten (W), molybdenum (Mo), ruthenium (Ru) or titanium nitride (TiN). In some embodiments, the first metal layer 130 consists essentially of cobalt (Co). In some embodiments, the first metal layer 130 consists essentially of tungsten (W). In some embodiments, the first metal layer 130 consists essentially of titanium nitride (TiN).

In some embodiments, an etch stop layer 150 is formed on the first metal layer 130. The etch stop layer 150 can be any suitable material formed by any suitable technique known to the skilled artisan.

In some embodiments, the etch stop layer 150 comprises one or more of aluminum oxide (AlOx), such as $Al_2O_3$, or aluminum nitride (AlNx). In some embodiments, the etch stop layer 150 consists essentially of one or more of aluminum oxide (AlOx) or aluminum nitride (AlNx). In some embodiments, the etch stop layer 150 comprises aluminum oxide (AlOx). In some embodiments, the etch stop layer 150 consists essentially of aluminum oxide (AlOx). In some embodiments, the etch stop layer 150 comprises aluminum nitride (AlNx). In some embodiments, the etch stop layer 150 consists essentially of aluminum nitride (AlNx).

In some embodiments, a second dielectric layer 160 is formed on the etch stop layer 150. The second dielectric layer 160 can be any suitable material formed by any suitable technique known to the skilled artisan. In some embodiments, the second dielectric layer 160 comprises one or more of an oxide or a nitride. In some embodiments, the second dielectric layer 160 comprises a low-K dielectric material. In some embodiments, the second dielectric layer 160 comprises silicon oxide. The second dielectric layer 160 of some embodiments is deposited by one or more of chemical vapor deposition (CVD), atomic layer deposition (ALD), plasma-enhanced chemical vapor deposition (PECVD), plasma-enhanced atomic layer deposition (PEALD), physical vapor deposition (PVD), or spin-on techniques.

The second dielectric layer 160 comprises a different material than the etch stop layer 150. The dielectric surface of the second dielectric layer 160 may comprise any suitable dielectric materials. Suitable dielectric materials include, but are not limited to, oxides (e.g., silicon oxides), low-K dielectric materials, and high-k dielectrics. In some embodiments, the dielectric surface consists essentially of silicon oxide. In some embodiments, the second dielectric layer 160 comprises one or more of silicon oxide ($SiO_2$), silicon nitride (SiN), silicon carboxynitride (SiCON), silicon oxycarbide (SiOC), aluminum oxide (AlOx), or aluminum nitride (AlNx). In some embodiments, the second dielectric layer 160 comprises the same material as the first dielectric layer 140. In some embodiments, the second dielectric layer 160 comprises a different material than the first dielectric layer 140.

The substrate 105 comprising the second dielectric layer 160, etch stop layer 150 and first metal layer 130 has a feature 170 formed therein. The feature 170 is formed in the second dielectric layer 160 and the etch stop layer 150 exposing a top surface 132 of the first metal layer 130. The feature 170 illustrated has a via portion 172 and a trench portion 174.

The via portion 172 extends through the second dielectric layer 160 and the etch stop layer 150 to the first metal layer 130. The via portion 172 exposes a top surface 132 of the first metal layer 130. The top surface 132 of the first metal layer 130 forms a bottom surface 164 of the via portion 172. The via portion 172 is bounded on one side by the sidewall 162 of the second dielectric layer 160 and the sidewall 163 of the etch stop layer 150. The via portion 172 is bounded on another side by a lower sidewall 167 of the second dielectric layer 160 and the sidewall 163 of the etch stop layer 150. The skilled artisan will recognize that the via portion 172 may have a circular cross-section and that the use of a first side and a second side (e.g., one side and another side) to describe the via portion 172 is for descriptive purposes based on the cross-sectional views in the Figures. When the via portion 172 is a cylindrical hole, the sidewalls of the dielectric layer and the etch stop layer are continuous so that there is effectively a single sidewall, rather than a first side and second side (e.g., one side and another side) that appears in the cross-section.

The trench portion 174 has a bottom surface 168 formed from the second dielectric layer 160 and is bounded on one side by upper sidewall 169 which comprises the second dielectric layer 160. The trench portion 174 has an open side where the via portion 172 passes through the second dielectric layer 160 and etch stop layer 150.

The portion of the feature 170 not bounded by the via portion 172 and the trench portion 174 can be collectively referred to as a gap.

Embodiments of the disclosure advantageously provide methods for surface pretreatment, such as selective blocking of metal surfaces (including but are not limited to copper, cobalt, tungsten, tantalum, tantalum nitride, tantalum oxide, titanium, titanium oxide, titanium nitride, ruthenium, ruthenium oxide and iridium etc.). Some embodiments advantageously provide methods to selectively grow a dielectric material on a dielectric surface such as $SiO_2$, SiN, SiCON, SiOC, etc.

The embodiment illustrated in FIG. 1 is the substrate 105 for further deposition processes. The etch stop layer 150 in the illustrated embodiment is one or more of aluminum oxide or aluminum nitride (AlNx), and the surface (sidewall 163) of the etch stop layer 150 is one or more of an aluminum oxide surface or an aluminum nitride surface. For the avoidance of doubt, no stoichiometric ratios are implied by the identification of materials disclosed herein, unless the context provides otherwise. For example, an aluminum oxide (AlOx) material contains aluminum and oxygen; an aluminum nitride (AlNx) material contains aluminum and nitrogen. These elements may or may not be present at a 1:1 ratio.

The substrate 105 has a metal surface (the bottom surface 164 of the via portion 172), a dielectric surface (sidewall 162, lower sidewall 167, bottom surface 168, upper sidewall 169, and top surface 161) and one or more of an aluminum oxide surface or an aluminum nitride surface (sidewall 163 of etch stop layer 150).

Figure 3:
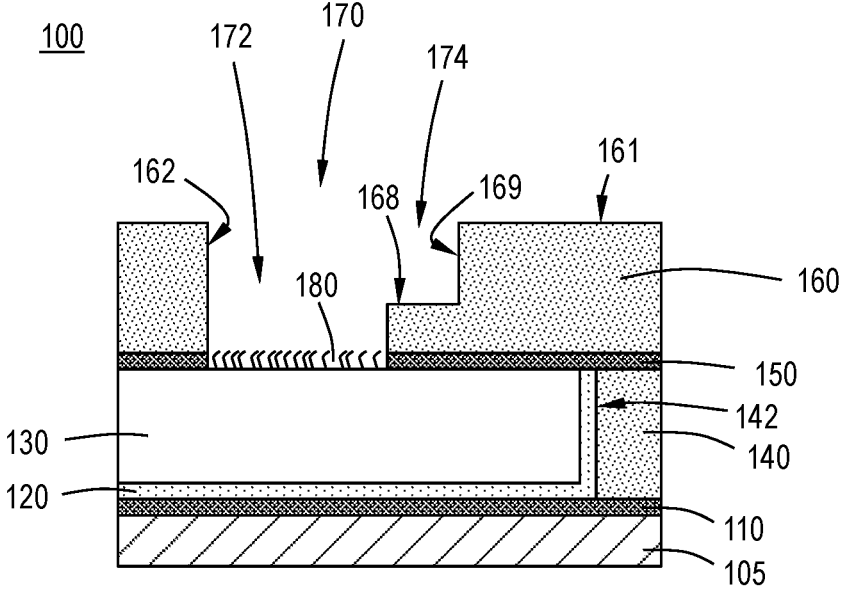
FIG. 3 illustrates a cross-sectional schematic view of the microelectronic device of FIG. 2 after formation of a blocking layer in accordance with one or more embodiments of the disclosure.

FIG. 3 illustrates the electronic device 100 of FIG. 2 after selectively depositing a blocking layer 180. The substrate 105 comprising the metal surface (the bottom surface 164 of the via portion 172), the dielectric surface (sidewall 162, lower sidewall 167, bottom surface 168, upper sidewall 169, and top surface 161) and one or more of the aluminum oxide surface or the aluminum nitride surface (sidewall 163 of etch stop layer 150) is exposed to a blocking molecule, (e.g., a silane) to form the blocking layer 180. The blocking layer 180 forms selectively on the metal surface (the bottom surface 164 of the via portion 172) over the dielectric surface (sidewall 162, lower sidewall 167, bottom surface 168, upper sidewall 169, and top surface 161) and the aluminum oxide surface or the aluminum nitride surface.

In some embodiments, the blocking molecule used to deposit the blocking layer 180 comprises a silane having a general formula of $R_{(4-n)}Si(CH_3)_n$, where n is 1 to 4, and each R is independently selected from an alkyl, aryl, alkene, alkyne group having in a range of from 1 to 22 carbon atoms. In some embodiments, the alkyl group includes straight chain groups (e.g., n-butyl), branched groups (e.g., t-butyl) or cyclic groups (e.g., cyclohexyl). As used in this manner, the letter "C" followed by a numeral (e.g., "C4") means that the substituent comprises the specified number of carbon atoms (e.g., C4 comprises four carbon atoms).

In some embodiments, the silane is carried in a suitable inert gas known to the skilled artisan. In some embodiments, the inert gas is selected from the group consisting of helium (He), neon (Ne), argon (Ar), and krypton (Kr).

In some embodiments, the blocking molecule used to deposit the blocking layer 180 comprises at least one compound comprising a general formula of $H_3Si$—$SiR_3$, where R is independently selected from an alkyl, aryl, alkene, alkyne group having in a range of from 1 to 22 carbon atoms. In some embodiments, the blocking molecule comprises (trimethylsilyl)silane.

In some embodiments, the blocking molecule used to deposit the blocking layer 180 comprises one or more of 1,2-phenylenebis(trimethylsilane) or 1,4-bis(trimethylsilyl)-1,3-butadiyne.

The blocking layer 180 is a metal silicide that is formed selectively on the metal surface. In some embodiments, the metal silicide is selectively formed on the metal surface (the bottom surface 164 of the via portion 172), over the dielectric surface (sidewall 162, lower sidewall 167, bottom surface 168, upper sidewall 169, and top surface 161) and one or more of the aluminum oxide surface or the aluminum nitride surface (sidewall 163 of etch stop layer 150). As used in this specification and the appended claims, the phrase "selectively over", or similar, means that the subject material is deposited on the stated surface to a greater extent than on another surface. In some embodiments, "selectively" means that the subject material forms on the selective surface at a rate greater than or equal to 10×, 15×, 20×, 25×, 30×, 35×, 40×, 45× or 50× the rate of formation on the non-selected surface.

In some embodiments, the blocking molecule is reacted with a metal surface (including but not limited to Cu, Co, W, and TiN) in solution or vapor phase. In some embodiments, the metal surface is cleaned prior to reaction with the blocking molecule. Organosilanes react with the metal surface selectively over a dielectric surface (e.g., $SiO_2$) and one or more of the aluminum oxide surface or the aluminum nitride surface (sidewall 163 of etch stop layer 150) through the silane head group. The organic portion of the silane acts as a hydrophobic protecting layer which blocks the growth of a subsequent dielectric layer (e.g., SiN) on metals enabling selective deposition of a dielectric on the dielectric surface.

The dielectric surface of the substrate may comprise any suitable dielectric materials. Suitable dielectric materials include, but are not limited to, oxides (e.g., silicon oxides), low-k dielectric materials and high-k dielectrics. In some embodiments, the dielectric surface consists essentially of silicon oxide. As used in this manner, the term "consists essentially of" means that the surface is greater than or equal to about 95%, 98% or 99% of the stated material, on an area basis.

The metal surface of the substrate may comprise any suitable metal materials. Suitable metal materials include, but are not limited to, metals, metal nitrides, metal alloys, and other conductive materials. In some embodiments, the metal surface comprises one or more of cobalt, tungsten or titanium nitride. In some embodiments, the metal surface consists essentially of cobalt. In some embodiments, the metal surface consists essentially of tungsten. In some embodiments, the metal surface consists essentially of titanium nitride.

In some embodiments, forming the blocking layer 180 comprises exposing soaking the substrate in the blocking molecule. In some embodiments, forming the blocking layer 180 comprises exposing the substrate to pulses of the blocking chemistry. The pulses of blocking chemistry can be any suitable duration and occur any suitable number of times. In some embodiments, during formation of the blocking layer 180 occurs with greater than 1, 10, 100, 250, 500 or 1000 pulses of blocking layer chemistry. In some embodiments, the total time for exposure to the blocking chemistry is greater than 1 second, 10 seconds, 100 seconds, 500 seconds or 1000 seconds.

In some embodiments, the silane groups cross-link with each other after deposition. In some embodiments, the blocking layer contains substantially no crosslinking between the silane groups. As used in this manner, the term "substantially no crosslinking" means that there is less than or equal to about 5%, 2% or 1% crosslinking on a surface area basis.

Some embodiments of the disclosure provide methods for improving performance of interconnects. Interconnects comprise metal lines that transfer current within the same device layer, and metal vias that transfer current between layers. These lines and vias are formed with conductive metal such as copper or cobalt in gaps formed within the device. In one or more embodiments, a dielectric layer comprises at least one feature defining a gap including sidewalls and a bottom. In one or more embodiments, the gap comprises the metal lines and the metal vias. In one or more embodiments, the metal lines have a sidewall and a bottom. In one or more embodiments, the metal vias have a sidewall and a bottom. As used in this specification and the appended claims, unless specified otherwise, reference to the "bottom of the gap" is intended to mean the bottom of the metal via, which is nearest the substrate.

As the technology node advances, for example, when scaling microelectronic devices and interconnects to the 3 nm node and beyond the back end of line (BEOL) includes new interfaces such as tungsten (W), molybdenum (Mo), and ruthenium (Ru). Improving self-assembled monolayer (SAM) selectivity on metal to low-k surfaces becomes more challenging, especially when these interfaces contain different kinds of impurities such as oxygen, carbon, nitrogen, fluorine, chlorine, etc. It has been determined that the pre-clean before SAM processes further improves SAM selectivity. Pre-cleaning helps control damage to low-k dielectric materials.

In some embodiments, the substrate 105 is cleaned prior to exposing the substrate 105 to the blocking molecule. In some embodiments, only the metal surface of the substrate is cleaned prior to exposing the substrate to the blocking molecule. In some embodiments, the substrate or the metal surface of the substrate is cleaned with a hydrogen plasma. In some embodiments, the hydrogen plasma is a conductively coupled plasma (CCP). In some embodiments, the hydrogen plasma is an inductively coupled plasma (ICP). In some embodiments, the hydrogen plasma comprises plasma of $H_2$. In some embodiments, the hydrogen plasma comprises or consists essentially of a combination of argon (Ar) and hydrogen ($H_2$). In some embodiments, the hydrogen plasma comprises or consists essentially of a combination of helium (He) and hydrogen ($H_2$).

In some embodiments, the barrier layer 190 is a dielectric layer that is selectively deposited on the dielectric surface after deposition of the blocking layer 180. In some embodiments, the barrier layer 190 comprises silicon nitride. Deposition of silicon nitride can be performed through any suitable process. Suitable processes may include exposure of the substrate to a silicon halide and ammonia. Suitable silicon halides include, but are not limited to dichlorosilane (DCS), trichlorosilane (TCS), tetrachlorosilane ($SiCl_4$), tetrabromosilane ($SiBr_4$), tetraiodosilane ($SiI_4$), and hexachlorodisilane (HCDS).

In some embodiments, the barrier layer 190 comprises or consists essentially of tantalum nitride (TaN). In some embodiments, the tantalum nitride (TaN) is deposited by a thermal atomic layer deposition (ALD) process. As used in this manner, a thermal process does not include a plasma. In some embodiments, the tantalum nitride is deposited using pentakis(dimethylamino)tantalum (PDMAT) and ammonia in a thermal ALD process.

In some embodiments, exposing the substrate to the blocking molecule is repeated after deposition of the barrier layer 190 to regenerate the blocking layer. In some embodiments, the barrier layer 190 is deposited again after the blocking layer is regenerated. In some embodiments, exposure of the substrate to a blocking molecule and depositing a barrier layer is repeated until the barrier layer has reached a predetermined thickness.

The exposure to the surface blocking chemistry, or blocking layer regeneration, can be performed once or repeated after a number of deposition cycles or after a predetermined film thickness is formed. In some embodiments, a barrier layer 190 is deposited with a thickness in the range of about 5 Å to about 50 Å, or in the range of about 10 Å to about 40 Å, or in the range of about 15 Å to about 35 Å before the blocking layer 180 is regenerated.

The blocking layer 180 is formed at a temperature that is favorable to close packing of the self-assembled monolayer of blocking chemistry species. In some embodiments, the substrate 105 is maintained at a temperature in the range of 100° C. to 500° C., or in the range of 150° C. to 450° C., or in the range of 200° C. to 400° C., or in the range of 225° C. to 350° C., or in the range of 250° C. to 350° C., or in the range of 250° C. to 300° C.

Some embodiments of the disclosure are directed to selective deposition of barrier layers on dielectric surfaces relative to metal surfaces. Selective barrier layers (e.g., tantalum nitride) can reduce the RC delay by >50%. Current processes deposit TaN selectively on copper using known SAMs for the N3 technology node. For next generation devices, selective deposition of tantalum nitride on dielectric surfaces relative to tungsten metal is desired.

Embodiments of the disclosure advantageously provide methods for surface pretreatment, such as selective blocking of metal surfaces (including but are not limited to copper, cobalt, tungsten, tantalum, tantalum nitride, tantalum oxide, titanium, titanium oxide, titanium nitride, ruthenium, ruthenium oxide and iridium etc.). Some embodiments advantageously provide methods to selectively grow a barrier material on a dielectric surface such as silicon oxide ($SiO_x$), silicon nitride (SiN), silicon carboxynitride (SiCON), silicon oxycarbide (SiCO), etc.

Pre-cleaning of the substrate can occur at any suitable temperature depending on, for example, the cleaning technique. In some embodiments, pre-cleaning of the substrate occurs at a temperature in the range of 200° C. to 500° C., or in the range of 300° C. to 400° C.

Figure 4:
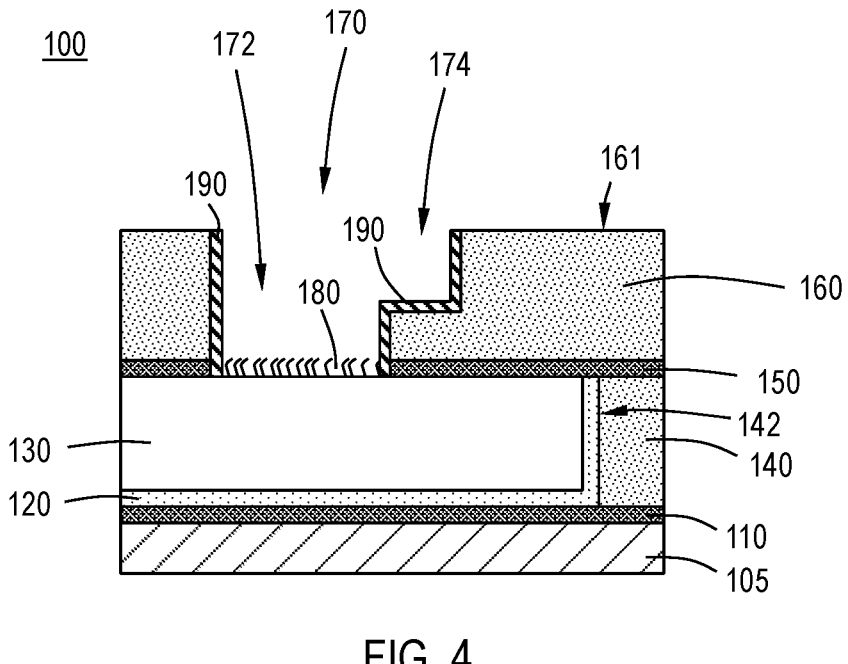
FIG. 4 illustrates a cross-sectional schematic view of the microelectronic device of FIG. 3 after formation of a barrier layer in accordance with one or more embodiments of the disclosure.

FIG. 4 illustrates the electronic device 100 of FIG. 3 after formation of a barrier layer 190 on the surfaces of the second dielectric layer 160 and etch stop layer 150. The barrier layer 190 of some embodiments comprises or consists essentially of tantalum nitride. In some embodiments, the first metal layer 130 comprises tungsten, the etch stop layer 150 comprises one or more of aluminum oxide or aluminum nitride, the second dielectric layer 160 comprises silicon oxide, and the barrier layer 190 comprises tantalum nitride.

In some embodiments, the metal surface (first metal layer 130 and bottom surface 164) comprises tungsten. In some embodiments, the metal surface (first metal layer 130 and bottom surface 164) consists essentially of tungsten. In some embodiments, the metal surface (first metal layer 130 and bottom surface 164) comprises cobalt. In some embodiments, the metal surface (first metal layer 130 and bottom surface 164) consists essentially of cobalt.

In some embodiments, the barrier layer 190 is selectively deposited on the top surface 161, sidewall 162, lower sidewall 167, bottom surface 168, upper sidewall 169 of the second dielectric layer 160 in the feature 170 and the surface (sidewall 163) of the etch stop layer 150 after formation of the blocking layer 180 on the underlying metal surface (bottom surface 164 of via portion 172). Stated differently, the barrier layer 190 is deposited on the sidewall 162, sidewall 163 of the via portion 172 and the bottom surface 168 and upper sidewall 169 of the trench portion 174 of the feature 170. In some embodiments, the barrier layer 190 forms on the sidewalls to the blocking layer 180 on the metal surface. In some embodiments, a small gap is formed between the bottom surface 164 of the via portion 172 and the bottom edge of the barrier layer 190 due to the presence of the blocking layer 180.

In some embodiments, the barrier layer 190 comprises tantalum nitride. In some embodiments, the barrier layer 190 consists essentially of tantalum nitride. Deposition of tantalum nitride can be performed by any suitable process known to the skilled artisan. In some embodiments, the barrier layer 190 comprises one or more of tantalum nitride (TaN), titanium nitride (TiN), silicon nitride (SiN), titanium silicon nitride (TiSiN), tantalum silicon nitride (TaSiN) or silicon oxynitride (SiON).

In the embodiment illustrated in the Figures, the barrier layer 190 is formed on the sidewall 162 of the via portion 172, the lower sidewall 167, bottom surface 168 and upper sidewall 169 of the trench portion 174 of the feature 170. The Figures do not show barrier layer 190 material on the top surface 161 of the second dielectric layer 160. In some embodiments, deposition of the barrier layer 190 results in formation of the barrier layer 190 on the top surface 161 of the second dielectric layer 160. The substrate 105 is then subjected to a process to remove the barrier layer 190 from the top surface 161 of the second dielectric layer 160, for example, by chemical mechanical planarization (CMP).

Blocking layer 180 formation on clean substrates comprising W, Si, $SiO_2$ and $Al_2O_3$ surfaces at different temperatures were subjected to a tantalum nitride deposition process. The tantalum nitride layer formed on each of the surfaces indicated that less than 5 Å of TaN forms on a W surface while greater than 18 Å forms on the $Al_2O_3$, $SiO_2$ and Si surfaces after 1000 deposition cycles. In some embodiments, the blocking layer 180 is reformed on the metal surface after less than or equal to 1000, 500, 400, 300, 200 or 100 cycles of TaN deposition.

In some embodiments, the barrier layer 190 is formed to a thickness in the range of 5 Å to 25 Å without reforming the blocking layer 180. In some embodiments, when 20 Å of tantalum nitride is formed on the dielectric surface and one or more of the aluminum oxide surface or the aluminum nitride surface, less than or equal to 4 Å of tantalum nitride is formed on the metal surface.

Figure 5:
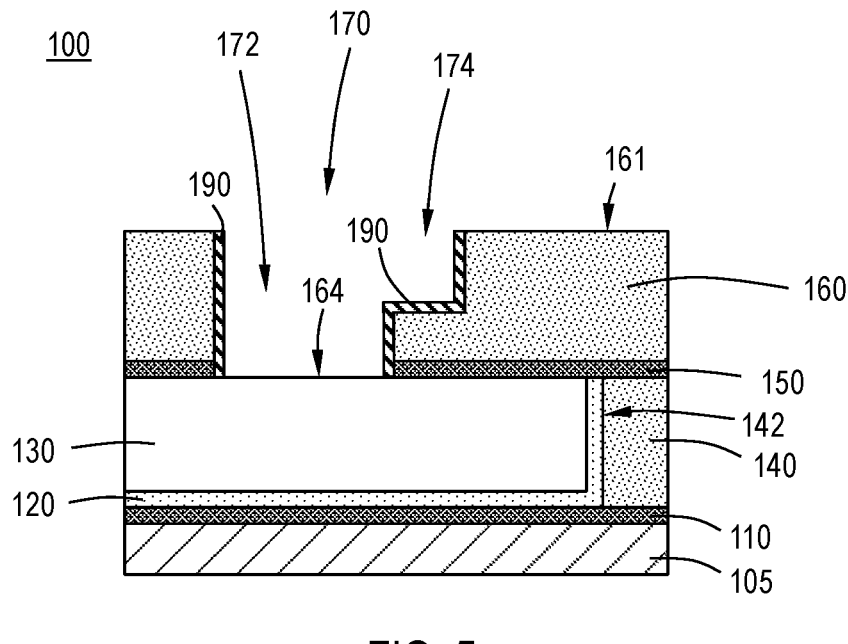
FIG. 5 illustrates a cross-sectional schematic view of the microelectronic device of FIG. 4 after removal of the blocking layer in accordance with one or more embodiments of the disclosure.

FIG. 5 illustrates the electronic device 100 of FIG. 4 after removal of the blocking layer 180 to expose the bottom surface 164 of the via portion 172, which is the top surface of the first metal layer 130. Removing the blocking layer 180 can be done by any suitable technique known to the skilled artisan. In some embodiments, removing the blocking layer 180 comprises exposing the blocking layer 180 to a plasma. In some embodiments, the plasma is an inductively coupled plasma (ICP). In some embodiments, the plasma is a capacitively coupled plasma (CCP). It has been advantageously found that exposing the blocking layer 180 to the plasma increases a density of the barrier layer 190.

In some embodiments, removing the blocking layer 180 results in a small gap between the top surface of the first metal layer 130 (bottom surface 164 of the via portion 172). This gap is negligible and does not affect subsequent processes. In some embodiments, removal of the blocking layer 180 results in substantially no gap between the top surface of the first metal layer 130 and the bottom edge of the liner 190.

Figure 6:
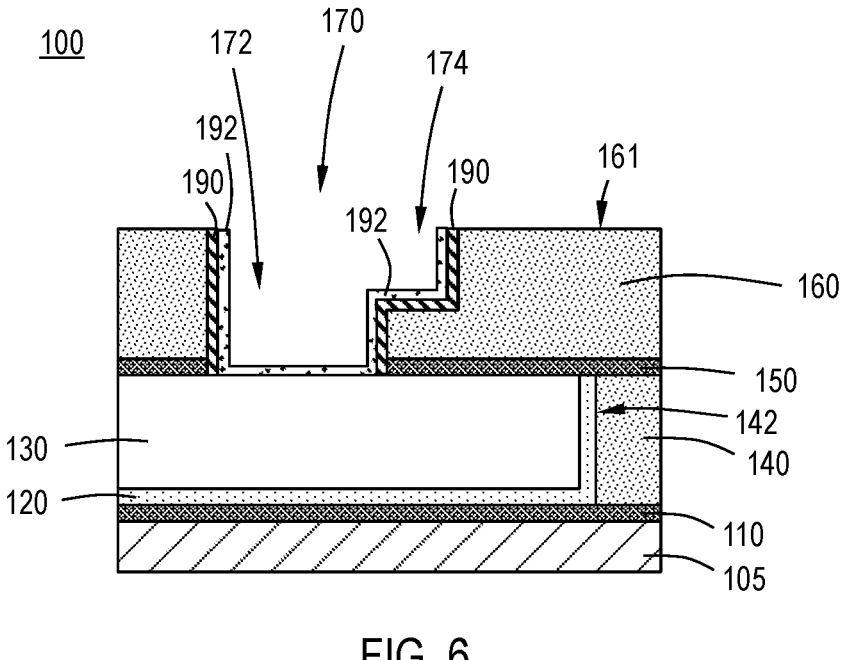
FIG. 6 illustrates a cross-sectional schematic view of the microelectronic device of FIG. 5 after formation of a metal liner in accordance with one or more embodiments of the disclosure.

FIG. 6 illustrates the electronic device of FIG. 5 after deposition of a metal liner 192 on the barrier layer 190 (optional operation 18). In some embodiments, the metal liner 192 is selectively deposited on the barrier layer 190 by any suitable deposition process described herein. In some embodiments, the metal liner 192 comprises one or more of ruthenium (Ru), cobalt (Co), molybdenum (Mo), or tantalum (Ta). The metal liner 192 of some embodiments comprises or consists essentially of cobalt (Co). In some embodiments, the metal liner 192 is formed to a thickness in the range of 5 Å to 25 Å.

In some embodiments, the metal liner 192 comprises cobalt (Co), the barrier layer 190 comprises tantalum nitride, the etch stop layer 150 comprises one or more of aluminum oxide aluminum oxide, the second dielectric layer 160 comprises silicon oxide, and the first metal layer 130 comprises tungsten.

Figure 7:
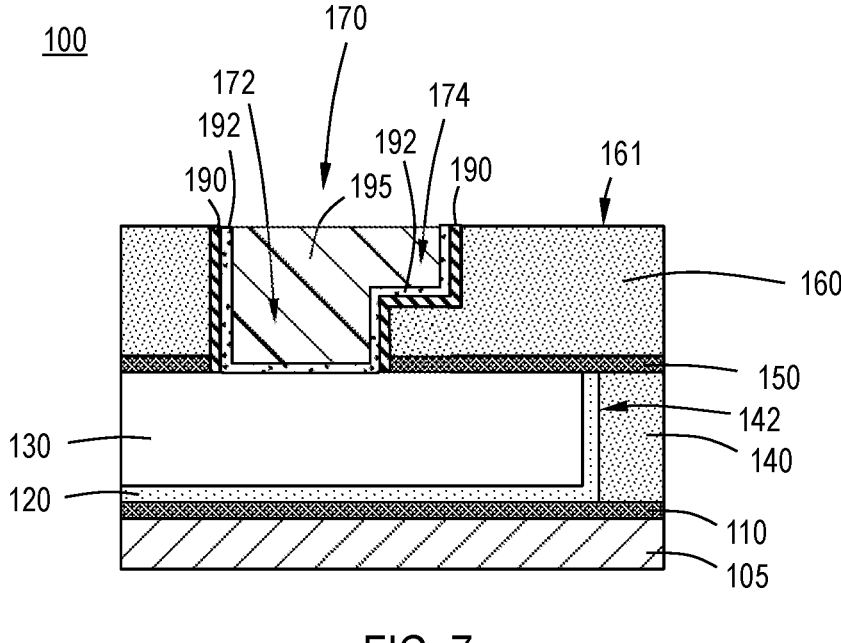
FIG. 7 illustrates a cross-sectional schematic view of the microelectronic device of FIG. 6 after formation of a second metal layer in accordance with one or more embodiments of the disclosure.

FIG. 7 illustrates the electronic device of FIG. 6 after deposition of a second metal layer 195 in the feature 170. Stated differently, FIG. 7 illustrates the gapfill process of operation 20. In some embodiments, the second metal layer 195 is deposited to fill the gap, i.e., the portion of the feature 170 not bounded by the via portion 172 and the trench portion 174. The second metal layer 195 is formed on the top surface of the first metal layer 130 (bottom surface 164 of the via portion 172). The second metal layer 195 deposits on the metal liner 192. The second metal layer 195 may also be referred to as a "gapfill material." In some embodiments, the gapfill material comprises copper (Cu) or cobalt (Co). In some embodiments, the gapfill material comprises copper (Cu). In some embodiments, the gapfill material comprises cobalt (Co). In some embodiments, the gapfill material consists essentially of copper (Cu). In some embodiments, the gapfill material consists essentially of cobalt (Co).

In some embodiments, the gapfill material comprises copper (Cu), the metal liner 192 comprises cobalt (Co), the barrier layer 190 comprises tantalum nitride, the etch stop layer 150 comprises one or more of aluminum oxide aluminum oxide, the second dielectric layer 160 comprises silicon oxide, the first metal layer 130 comprises tungsten, and the second metal layer 195 forms on the top surface of the first metal layer 130 that is exposed through the via portion 172 of the feature 170 and on the metal liner 192.

In embodiments where the metal liner 192 is not present, the second metal layer 195 forms on the top surface of the first metal layer 130 that is exposed through the via portion 172 of the feature 170, the barrier layer 190 on the sidewall 162 of the via portion 172, and on the barrier layer 190 of the lower sidewall 167, bottom surface 168 and upper sidewall 169 of the trench portion 174.

In some embodiments, a blanket deposition process deposits a second metal layer 195 into the feature 170 and on the top surface 161 of the second dielectric layer 160. The second metal layer 195 is formed on the top surface 161 of the second dielectric layer 160 can be removed by any suitable technique including, but not limited to, etching and chemical mechanical planarization.

One or more embodiments of the disclosure are directed to a non-transitory computer readable medium including instructions, that, when executed by a controller of a processing chamber, cause the processing chamber to perform the operations of method 10. In some embodiments, the non-transitory computer readable medium includes instructions, that, when executed by a controller of a processing chamber, cause the processing chamber to: expose a feature extending into a semiconductor substrate to blocking molecule to form a blocking layer, the feature defining a gap including a metal surface, a dielectric surface, and an aluminum oxide surface or an aluminum nitride surface, the blocking layer forming selectively on the metal surface over the dielectric surface and one of the aluminum oxide surface or the aluminum nitride surface (operation 12); selectively deposit a barrier layer on the dielectric surface and one of the aluminum oxide surface or the aluminum nitride surface over the blocking layer (operation 14); remove the blocking layer (operation 16); optionally, selectively deposit a metal liner on the barrier layer (operation 18); and performing a gapfill process (operation 20).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a microelectronic device, the method comprising:

exposing a feature extending into a semiconductor substrate to a silane having a general formula of $R_{(4-n)}Si(CH_3)_n$, where n is 1 to 4, and each R is independently selected from an alkyl, aryl, alkene, alkyne group having in a range of from 1 to 22 carbon atoms to form a blocking layer, the feature defining a gap including a metal surface, a dielectric surface, and an aluminum oxide surface or an aluminum nitride surface, the blocking layer forming selectively on the metal surface over the dielectric surface and one of the aluminum oxide surface or the aluminum nitride surface;

selectively depositing a barrier layer on the dielectric surface and one of the aluminum oxide surface or the aluminum nitride surface over the blocking layer; and removing the blocking layer.

2. The method of claim 1, wherein the silane is carried in an inert gas selected from the group consisting of helium (He), neon (Ne), argon (Ar), and krypton (Kr).

3. The method of claim 1, wherein the metal surface comprises tungsten (W).

4. The method of claim 1, wherein the dielectric surface comprises a low-K dielectric material.

5. The method of claim 1, wherein selectively depositing the barrier layer comprises an atomic layer deposition (ALD) process.

6. The method of claim 1, wherein the barrier layer comprises tantalum nitride (TaN).

7. The method of claim 1, further comprising selectively depositing a metal liner on the barrier layer.

8. The method of claim 7, wherein the metal liner comprises one or more of ruthenium (Ru), cobalt (Co), molybdenum (Mo), or tantalum (Ta).

9. The method of claim 1, wherein removing the blocking layer comprises exposing the blocking layer to a plasma.

10. The method of claim 9, wherein the plasma is an inductively coupled plasma (ICP).

11. The method of claim 9, wherein the plasma is a capacitively coupled plasma (CCP).

12. The method of claim 9, wherein exposing the blocking layer to the plasma increases a density of the barrier layer.

13. The method of claim 1, further comprising performing a gapfill process to deposit a gapfill material within the gap.

14. The method of claim 13, wherein the gapfill material comprises copper (Cu) or cobalt (Co).

15. The method of claim 1, wherein the method reduces resistance of a via by at least 20% as compared to a method that does not include forming a blocking layer that forms selectively on a metal surface relative to a dielectric surface and an aluminum oxide surface or an aluminum nitride surface.

16. A method of forming a microelectronic device, the method comprising:

exposing a feature extending into a semiconductor substrate to a blocking molecule comprising a general formula of $H_3Si$—$SiR_3$, where R is independently selected from an alkyl, aryl, alkene, alkyne group having in a range of from 1 to 22 carbon atoms to form a blocking layer, the feature defining a gap including a metal surface, a dielectric surface, and an aluminum oxide surface or an aluminum nitride surface, the blocking layer forming selectively on the metal surface over the dielectric surface and one of the aluminum oxide surface or the aluminum nitride surface;

selectively depositing a barrier layer on the dielectric surface and one of the aluminum oxide surface or the aluminum nitride surface over the blocking layer; and removing the blocking layer.

17. The method of claim 16, wherein the blocking molecule comprises (trimethylsilyl)silane.

18. The method of claim 16, further comprising performing a gap fill process after removing the blocking layer, the gap fill process comprising filling the gap with one or more of copper (Cu) or cobalt (Co).

19. A method of forming a microelectronic device, the method comprising:

exposing a feature extending into a semiconductor substrate to a blocking molecule comprising one or more of 1,2-phenylenebis(trimethylsilane) or 1,4-bis(trimethylsilyl)-1,3-butadiyne to form a blocking layer, the feature defining a gap including a metal surface, a dielectric surface, and an aluminum oxide surface or an aluminum nitride surface, the blocking layer forming selectively on the metal surface over the dielectric surface and one of the aluminum oxide surface or the aluminum nitride surface;

selectively depositing a barrier layer on the dielectric surface and one of the aluminum oxide surface or the aluminum nitride surface over the blocking layer; and removing the blocking layer.

20. The method of claim 19, further comprising performing a gap fill process after removing the blocking layer, the gap fill process comprising filling the gap with one or more of copper (Cu) or cobalt (Co).

* * * * *